(12) United States Patent
Wang et al.

(10) Patent No.: US 11,018,701 B2
(45) Date of Patent: May 25, 2021

(54) RELIABLE DATA TRANSMISSION METHOD BASED ON RELIABLE UDP AND FOUNTAIN CODE IN AERONAUTICAL AD HOC NETWORKS

(71) Applicant: SICHUAN UNIVERSITY, Sichuan (CN)

(72) Inventors: Junfeng Wang, Chengdu (CN); Qin Luo, Chengdu (CN); Ying Liu, Chengdu (CN); Hao Niu, Chengdu (CN)

(73) Assignee: SICHUAN UNIVERSITY, Chengdu (CN)

( * ) Notice: Subject to any disclaimer, the term of this patent is extended or adjusted under 35 U.S.C. 154(b) by 27 days.

(21) Appl. No.: 16/219,868

(22) Filed: Dec. 13, 2018

(65) Prior Publication Data

US 2019/0190542 A1 Jun. 20, 2019

(30) Foreign Application Priority Data

Dec. 14, 2017 (CN) .......................... 201711337419.6

(51) Int. Cl.
*H03M 13/37* (2006.01)
*H04L 12/26* (2006.01)
(Continued)

(52) U.S. Cl.
CPC ...... *H03M 13/3761* (2013.01); *H04L 1/0057* (2013.01); *H04L 1/18* (2013.01);
(Continued)

(58) Field of Classification Search
CPC .. H03M 13/3761; H04L 1/18; H04L 43/0841; H04L 47/34; H04L 43/0864;
(Continued)

(56) References Cited

U.S. PATENT DOCUMENTS 9,456,377 B2 * 9/2016 Han .................. H04W 28/0242
10,135,956 B2 * 11/2018 Choi .................... H04L 69/161
(Continued)

OTHER PUBLICATIONS

Nov. 25, 2020 Office Action issued in Chinese Patent Application No. 201711337419.6.

*Primary Examiner* — James C Kerveros
(74) *Attorney, Agent, or Firm* — Oliff PLC

(57) ABSTRACT

This invention discloses a kind of reliable data transmission method based on reliable UDP and fountain code in aeronautical ad hoc networks. This method employs Raptor codes to recover from data loss and avoid retransmission in high loss and high delay channels. A light-weight feedback scheme is designed to provide reliability. An improved SNACK scheme is utilized to deal with the bandwidth asymmetric problem and a novel sliding window mechanism is proposed to avoid TCP's retransmission ambiguity problem and allow for more precise roundtrip-time calculation. A congestion control scheme is deployed to distinguish losses caused by congestion from losses caused by link handoffs to efficiently utilize the available bandwidth. This invention is fully implemented directly on top of UDP in Linux without requiring changes to the underlying network stack implementations. In harsh aeronautical ad hoc network environment, it is suitable for reliable and efficient data transfer service.

8 Claims, 5 Drawing Sheets

(51) Int. Cl.
*H04L 12/801* (2013.01)
*H04W 84/18* (2009.01)
*H04L 1/00* (2006.01)
*H04L 1/18* (2006.01)

(52) U.S. Cl.
CPC ...... *H04L 43/0841* (2013.01); *H04L 43/0864* (2013.01); *H04L 47/34* (2013.01); *H04W 84/18* (2013.01); *H04L 43/0829* (2013.01); *H04L 43/0852* (2013.01)

(58) Field of Classification Search
CPC .............. H04L 1/0057; H04L 43/0829; H04L 43/0852; H04L 47/283; H04L 47/193; H04L 47/27; H04L 1/1628; H04L 1/1635; H04L 1/187; H04L 47/196; H04L 47/225; H04L 47/263; H04W 84/18; H04W 28/021

USPC ....................................................... 714/776
See application file for complete search history.

(56) References Cited

U.S. PATENT DOCUMENTS

| 10,263,904 B2* | 4/2019 | Wang ..................... H04L 1/1825 |
| 2005/0058131 A1* | 3/2005 | Samuels ................. H04L 41/00 370/389 |
| 2005/0063307 A1* | 3/2005 | Samuels ............ H04L 67/2876 370/235 |
| 2014/0192639 A1* | 7/2014 | Smirnov ................. H04L 47/10 370/230 |
| 2015/0372908 A1* | 12/2015 | Kashyap ............. H04L 43/0829 370/392 |

* cited by examiner

RELIABLE DATA TRANSMISSION METHOD BASED ON RELIABLE UDP AND FOUNTAIN CODE IN AERONAUTICAL AD HOC NETWORKS

FIELD OF TECHNOLOGY

This invention involves the end-to-end reliable transmission field, which involves a kind of reliable data transmission method based on reliable UDP and fountain code that specific to aeronautical ad hoc networks.

BACKGROUND TECHNOLOGY

Recently, with the explosive growth of global mobile Internet, the wide spread use of on-board broadband Internet access especially in the case of aeronautical systems has also been taking off. As more and more users begun exploiting the service, satellite resources in conventional aeronautical satellite communication may become limited. Therefore, new methods of communication can be integrated into the existing architecture. The network architecture is extended to include multi-hop ad hoc networking between aircraft, in addition to direct communication with ground stations and satellite usage, giving birth to a new breed of network, namely, aeronautical ad hoc network (AANET). Different from terrestrial ad hoc networks, AANETs behave distinguishing features, such as large and volatile delays, high channel error rates, constrained and highly-asymmetric bandwidth and frequent link handoffs caused by high mobility of the aircraft. This has a great impact on the performance of data transport protocol, and as a result, providing efficient and reliable data transport services to support broadband Internet access in AANETs is a great challenge.

The aeronautical community is already moving to replace the OSI-based Aeronautical Telecommunications Network (ATN) with the more efficient and widespread TCP/IP protocols. However, in AANET with high loss and delay, the performance of conventional TCP degrades significantly due to frequent retransmissions of lost or erroneous packets. In addition, in the case of highly-asymmetric channels, TCP may cause reverse link to be congested, leading to packet losses in that link. Furthermore, several other aspects of TCP, including flow control mechanism, assumption that all losses are due to congestion, also result in severe reduction of the throughput in harsh aeronautical network environment. A lot of researches have been done to improve the efficiency of TCP, but they are still not efficient enough to satisfy the transmission requirement in AANETs.

The other commonly used Internet transport protocol is UDP. Though UDP is light weight and fast, it does not offer any assurance or notification of correct delivery. Currently, there are two distinct approaches to UDP-based reliable transmission design, namely reliable UDP and fountain code-based UDP.

Reliable UDP focused their attention on exploiting and implementing the key strengths of TCP, such as acknowledgements and retransmissions. RBUDP transmits control information using TCP while data information is transmitted using UDP. The sender and the receiver make use of the buffer size field in ensuring the correct arrangement of the packets. However, the constant sending speed model makes the buffer of the receiver overflow, thus causing terminal congestion. CRETP employs a conditional retransmission mechanism and acknowledgements while keeping the timeliness of data transfer in mind. However, the retransmission could introduce additional delay which could impact negatively on time-critical applications. RUFC is an efficient and flexible framework to support reliable UDP with flow control. The framework fits between the transport layer employing UDP and the application layer and is capable of supporting policy customization and parameter tuning to achieve the optimal application performance. In AANETs with high packet loss rate and high latency variation, reliable UDP may suffer from severe performance degradation due to frequent retransmissions and reordering.

Some fountain codes-based methods have also been proposed to provide reliable transfer services on UDP. Fountain codes, as the forward error correction (FEC) codes, break the fixed rate limit of the traditional erasure code, thus it can be applied to any network due to its flexibility, coding efficiency, and complexity. LTTP, a fountain-code based transport protocol for data center, is proposed to ensure reliable data delivery. LTTP improves UDP-based LT code for reliable delivery, and employs TFRC (TCP Friendly Rate Control) to adjust the traffic sending rates at servers. Fountain codes over UDP are exploited to improve the quality of voice transmission to cloud-based speech recognition systems. The results show the solution improves the accuracy and reduces delay under packet loss and jitter. Although fountain code-based UDP can obtain a relatively high success rate and no retransmission delay, it can't guarantee 100 percent success rate by using a finite of redundant packets. Therefore, the correction capability of the method is limited and the reliable transmission effect is unstable in AANETs.

CONTENTS OF THE INVENTION

This invention aims to solve the technical problem which offers a reliable transmission method based on reliable UDP and fountain code (hereafter referred to as FRUDP protocol) to satisfy the efficient and reliable transmission demand in AANETs.

To solve the technical problem mentioned above, the technical program adopted by this invention is:

A reliable data transmission method based on reliable UDP and fountain code, which includes the steps as follows:

Step 1: At the sender side, the transmission data is divided into data packets, and these are moved to reliability unit. In reliability unit, a light-weight feedback is designed. An improved SNACK scheme is introduced to deal with the bandwidth asymmetric problem. The acknowledgement packets specify not only the highest contiguous sequence number of received packets but also a list of missing sequence numbers. And a novel sliding window mechanism is proposed to avoid TCP's retransmission ambiguity problem and allow for more precise roundtrip-time (RTT) calculation. In the proposed mechanism, the window will continue to slide forward as long as the acknowledgement for the packet has been received, regardless of whether the packet has been received correctly.

Step 2: Then the packets are transferred to the Raptor encoder buffer. We start an encoding timer in order to collect enough symbols to deploy encoding. If the traffic is so heavy that the amount of symbols at the Raptor encoder buffer is sufficient in a very short time, Raptor encoding is performed with the code rate determined by the code rate determining unit. However, if the traffic is so light that Raptor encoder buffer doesn't have enough symbols to code, the encoding timer will finally expire and the original symbols are forwarded directly to UDP.

The code rate determining algorithm is described as follows:

First, estimate packet loss rate $P_{loss}$ for the next block b. Then calculate Raptor decoding failure rate $\delta_b(m)$ for block b. Last, determine the code rate c.

Step 3: The generated redundant symbols and the source symbols are then delivered to the send buffer. To regulate the transmission rate of UDP flows, the congestion control algorithm which can differentiate losses caused by Internet congestion from losses caused by link handoffs is adopted:

1) Packet Loss

When SNACK is received and it has the missing sequence numbers, FRUDP further determine whether the packet loss is caused by congestion or the link handoffs. If the losses are caused by link handoffs, the minimum round-trip time (RTT) is set by the round-trip time that is observed now. Otherwise the losses are caused by network congestion and the congestion window is reduced.

2) Acknowledgement

When the new acknowledgement is received, first, dynamically modify the parameters $\alpha$ and $W_{tar}$. A threshold value, $\alpha$ is set to estimate the number of packets cached by the router in the network. $W_{tar}$ is the value of target window. Then, update the congestion window.

Step 4: At the receiver side, Raptor decoding is performed to recover the lost packet. If the decoding process cannot recover all the source symbols, the reliability unit will inform the sender to resend the missing symbols to provide reliability. The FRUDP on the receiver side periodically feeds network information, including the delay and packet loss rate, back to the sender side.

According to the program mentioned above, in Step 2, the formula to estimate packet loss rate $P_{loss}$ for the next block is as follows:

$$p_{loss} = \sqrt{\sigma^2_{ploss}} \cdot Q^{-1}(\rho^{under}) + \mu_{ploss}$$

where $P_{loss}$ is Gaussian distributed and represented by $P_{loss} \sim N(\mu_{ploss}, \sigma^2_{ploss})$, $\mu_{ploss}$ and $\sigma^2_{ploss}$ are the mean and variance, $\rho^{under}$ is the underestimation probability of $P_{loss}$, Q-function is the tail probability of the standard normal distribution.

According to the program mentioned above, in Step 2, the formula to calculate Raptor decoding failure rate $\delta_b(m)$ for block b is as follows:

$$\delta_b(m) = P((X < n_{min}) \mid X \sim B(n_{enc}, 1-p_{loss})) = \sum_{i=0}^{n_{min}-1} \binom{n_{enc}}{i}(1-p_{loss})^i p_{loss}^{n_{enc}-i}$$

where $n_{min}$ is the minimum number of packets required for successful Raptor decoding and $n_{min}=(1+\varepsilon)k$, $\varepsilon$ is the minimum symbol overhead with target decoding success probability $\tau_{succ}$, k is the given number of source symbols, $n_{enc}$ is the number of encoded symbols and $n_{enc}=n_{min}+m$, where m is the extra packets sent for a block to protest against channel loss.

According to the program mentioned above, in Step 2, the formula to determine the code rate c is as follows:

$$c = \frac{n_{min} + m*}{k}$$

In order to ensure the block has the maximum acceptable decoding failure probability and reduce the redundancy, the value of m should be set to the smallest integer m* such that $\delta_b(m)$ is no more than $\delta$. $\delta$ is the maximum acceptable decoding failure probability.

According to the program mentioned above, in Step 3, the method to determine whether loss is caused by congestion or link handoffs is as follows:

First, calculate the number of queued packets in the current network in accordance with the formula diff=(W/baseRTT−W/SRTT)×baseRTT. diff refers to the difference between the current congestion window and the actual network, W refers to current congestion window, baseRTT is the minimum RTT that has been observed so far, SRTT is an exponentially smoothed RTT and maintained with the method used in TCP Reno. W/baseRTT is the expected throughput, and W/SRTT is the actual throughput. Then, compare the value of diff and $\alpha$. When diff>$\alpha$, calculate the values of throughput Thr, last_Thr by the successive two ACKs. Last, estimate packet loss reason. If Thr<last_Thr, then the losses are caused by link handoffs, otherwise the losses are caused by network congestion.

According to the program mentioned above, in Step 3, the formula to update the congestion window is as follows:

$$W = W*(1-\beta)$$

where $\beta$ is a window decrease constant.

According to the program mentioned above, in Step 3, the method to update the parameters $\alpha$ and $W_{tar}$ is as follows:

If diff is less than $\alpha$, and SRTT is less than last_SRTT, which is the value of smoothed RTT calculated for the last ACK, or $\alpha$ is equal to 1, it indicates that the queuing is light, and the target window $W_{tar}$ can be appropriately increased in order to make full use of the bandwidth. If diff is greater than $\alpha$, if SRTT is greater than last_SRTT and $\alpha$ is greater than 1, there may be two cases: link handoffs or network tends to congestion. We use the method introduced in claim 5 to judge the reason. If the increase of SRTT is caused by link handoffs, baseRTT is updated by the RTT that is observed now. Otherwise, it shows the queuing along the path becomes heavy, and the value of $\alpha$ can be appropriately reduced, so we take $\alpha=\alpha-1$. And if SRTT is less than or equal to last_SRTT, it shows the queuing is getting lighter, and the value of $\alpha$ can be appropriately increased, so we take $\alpha=\alpha+1$.

According to the program mentioned above, in Step 3, the formula to reduce the congestion window in Step 3 is as follows:

$$W(t) = C(t-K)^3 + W_{tar}$$

where $$K = \sqrt[3]{\frac{W_{max}\beta}{C}}$$

and K is the time period that the above function takes to increase W to $W_{max}$ when there is no further loss event. C is a Cubic parameter, t is the elapsed time from the last window reduction, $W_{max}$ is the window size where the loss event occurs.

Being compared with the current technology, the beneficial effects of this invention are: 1) It has the feature of adjusting redundancy on the fly by considering the time-varying aeronautical network conditions. The invention constrains the underestimation packet loss probability to within a reasonable range and estimates the packet loss rate for the next block with this underestimation probability. Through this way, it can forecast the redundancy for the next block with the estimated packet loss rate to avoid retransmission. 2) This invention can differentiate losses caused by congestion from losses caused by link handoffs. When the losses are judged by link handoffs, the window will not be reduced and the throughput is increased. 3) This invention is fully implemented in Linux without requiring changes to the underlying network stack implementations. The proposed protocol is easy to use and is also easy to be integrated into all kinds of application layer protocols based on the reliable transmission in AANETs.

SPECIFICATION OF THE ATTACHED FIGURES

SPECIFIC IMPLEMENTATION METHOD

Figure 1:
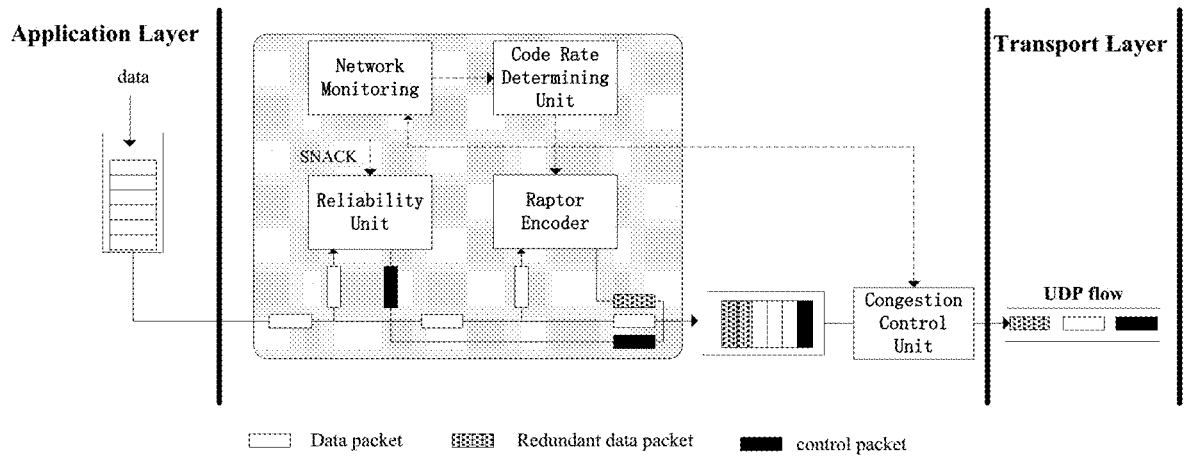
FIG. 1 shows the architecture of FRUDP (sender side).

Further specific specification is given as follows by combining the attached figures and the implementation case in detail. This invention offers a kind of reliable data transmission method in AANETs based on reliable UDP and fountain code, which will be further illustrated in conjunction with FIG. 1.

Step 1: At the sender side, the transmission data is divided into data packets, and these are moved to reliability unit. In reliability unit, a light-weight feedback is designed. An improved SNACK scheme is introduced to deal with the bandwidth asymmetric problem and a novel sliding window mechanism is proposed to avoid TCP's retransmission ambiguity problem and allow for more precise roundtrip-time (RTT) calculation.

The acknowledgement packets in SNACK specify not only the highest contiguous sequence number of received packets but also a list of missing sequence numbers. When the sender receives the ACK, it uses the sending queue to determine which packets have been received and which packets have been lost. In the proposed sliding window mechanism, the window will continue to slide forward as long as the acknowledgement for the packet has been received, regardless of whether the packet has been received correctly. If a packet is lost, it will be retransmitted with a new sequence number, and the receiver uses the offset of the packet to determine the location of the packet in the entire file.

Step 2: Then the packets are transferred to the Raptor encoder buffer. We start an encoding timer in order to collect enough symbols to deploy encoding. If the traffic is so heavy that the amount of symbols at the Raptor encoder buffer is sufficient in a very short time, Raptor encoding is performed with the code rate determined by the code rate determining unit. However, if the traffic is so light that Raptor encoder buffer doesn't have enough symbols to code, the encoding timer will finally expire and the original symbols are forwarded directly to UDP.

Figure 2:
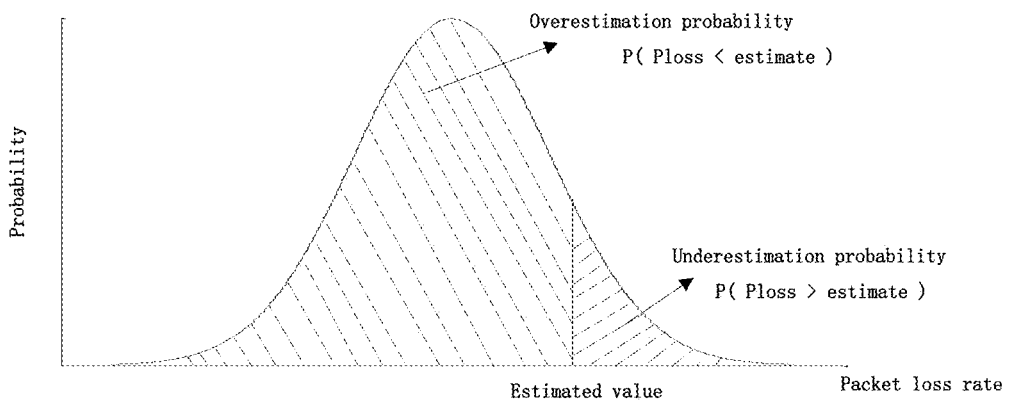
FIG. 2 shows the over-estimation and underestimation probability compared to the $P_{loss}$ to be observed.

The code rate determining algorithm is described as follows:

1、Based on FIG. 2, estimate packet loss rate $P_{loss}$ for the next block with the underestimation probability $\rho^{under}$ using Q-function in accordance with the formula $p_{loss} = \sqrt{\sigma^2_p} \cdot Q^{-1}(\rho^{under}) + \rho_{ploss}$. Therein, $P_{loss}$ is Gaussian distributed and represented by $P_{loss} \sim N(\mu_{ploss}, \sigma^2_p)$, $\mu_{ploss}$ and $\sigma^2_{ploss}$ are the mean and variance, which can calculated from the most recently reported values of $P_{loss}$.

2、Calculate Raptor decoding failure rate $\delta_b(m)$ for block b using a binomial distribution in accordance with the formula $$\delta_b(m) = P((X < n_{min}) \mid X \sim B(n_{enc}, 1 - p_{loss})) = \sum_{i=0}^{n_{min}-1} \binom{n_{enc}}{i}(1 - p_{loss})^i p_{loss}^{n_{enc}-i}.$$

Therein, $n_{min}$ is the minimum number of packets required for successful Raptor decoding and $n_{min} = (1+\varepsilon)k$, where $\varepsilon$ is the minimum symbol overhead with target decoding success probability $\tau_{succ}$, k is the given number of source symbols. $n_{enc}$ is the number of encoded symbols and $n_{enc} = n_{min} + m$, where m is the extra packets sent for a block to protest against channel loss.

3、Determine the code rate c in accordance with the formula $$c = \frac{n_{min} + m*}{k}.$$

Maximum acceptable decoding failure probability $\delta$ is the threshold to predict whether a block can be successfully decoded by the receiver. In order to ensure the block has the maximum acceptable decoding failure probability and reduce the redundancy, the value of m should be set to the smallest integer m* such that $\delta_b(m)$ is no more than $\delta$.

Figure 3:
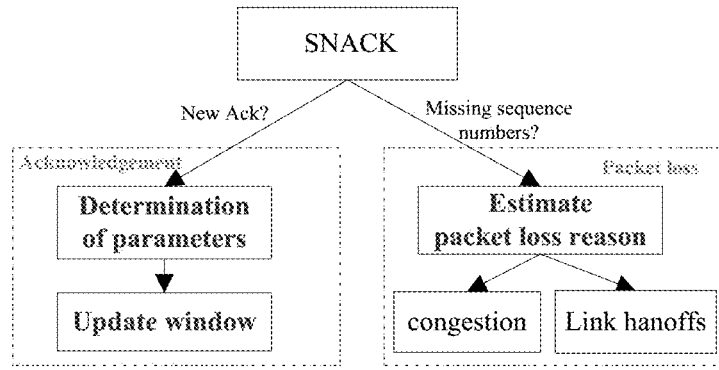
FIG. 3 shows the flow chart of congestion control algorithm in FRUDP.

Step 3: The generated redundant symbols and the source symbols are then delivered to the send buffer. To regulate the transmission rate of UDP flows, the congestion control algorithm which can differentiate losses caused by Internet congestion from losses caused by link handoffs is adopted, as shown in FIG. 3:

1、Packet Loss

When SNACK is received and it has the missing sequence numbers, FRUDP further determine whether the packet loss is caused by congestion or the link handoffs. Calculate the number of queued packets in the current network in accordance with the formula diff=(W/baseRTT−W/SRTT)×baseRTT. diff refers to the difference between the current congestion window and the actual network, W refers to current congestion window, baseRTT refers to an estimation of the transmission delay of a packet over the network path, SRTT is an exponentially smoothed RTT and maintained with the method used in TCP Reno. W/baseRTT is the expected throughput, and W/SRTT is the actual throughput. A threshold value, $\alpha$, is set to estimate the number of packets cached by the router in the network.

When diff>$\alpha$, calculate the values of throughput Thr, last_Thr by the successive two ACKs. Then, judge packet loss reason, as shown in Algorithm 1, where $\beta$ is a window decrease constant.

---
Algorithm 1 Estimating Packet Loss Reason Process packet loss events are detected;
if (diff > $\alpha$ ) then
   if (Thr < last _ Thr ) then
      $W_{max}$ = W
      w = w * (1 − $\beta$)
   else
      $w_{max}$ = w
      baseRTT = RTT
      $W_{max}$ = W
else
   baseRTT = RTT
---

2、Acknowledgement

When the new acknowledgement is received, dynamically modify the parameters $\alpha$ and $W_{tar}$, as shown in Algorithm 2.

---
Algorithm 2 Parameters Determination Process set $\alpha$ = 1 ;
if ( diff < $\alpha$ & & (SRTT < last _ SRTT || $\alpha$ = = 1) ) then
   $W_{tar}$ = $W_{tar}$ + 1 ;
else if (diff > $\alpha$ ) then
   if (SRTT > last _ SRTT & & $\alpha$ > 1 ) then
      if (Thr > last _Thr ) then
         baseRTT = RTT ;
      else $\alpha$ = $\alpha$ − 1;
   else if (SRTT ≤ last _ SRTT ) then
      $\alpha$ = $\alpha$ + 1 ;
   end if
else $\alpha$ = $\alpha$ − 1;
---

Then, update window in accordance with the formula $W(t)=C(t-K)^3+W_{tar}$. Where $$K = \sqrt[3]{\frac{W_{max}\beta}{C}}$$

and K is the time period that the above function takes to increase W to $W_{max}$ when there is no further loss event. C is a Cubic parameter, t is the elapsed time from the last window reduction, $W_{max}$ is the window size where the loss event occurs.

Step 4: At the receiver side, Raptor decoding is performed to recover the lost packet. If the decoding process cannot recover all the source symbols, the reliability unit will inform the sender to resend the missing symbols to provide reliability. The FRUDP on the receiver side periodically feeds network information, including the delay and packet loss rate, back to the sender side.

Further specification is given for this invention through FIG. 4 to FIG. 11.

Figure 4:
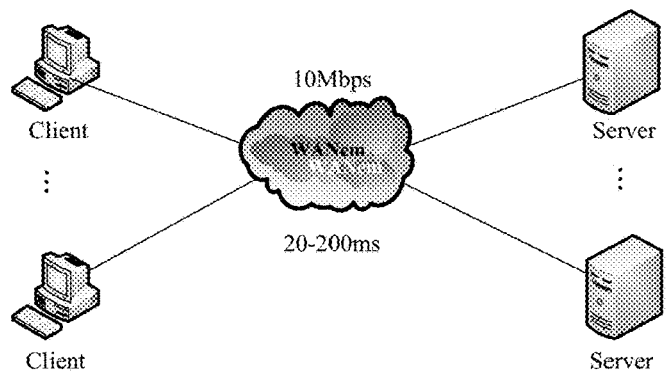
FIG. 4 shows the network topology with single bottleneck link shared by one or multiple users.

FIG. 4 is the network topology with single bottleneck link shared by one or multiple users.

The experiments are performed on a desktop that is running on Ubuntu 14.04 with an Intel Core i5-3320M processor and 8 GB RAM. The proposed FRUDP is fully implemented in Linux kernel 3.19.0. A WANem network emulator is employed to emulate network impairments encountered by a packet while traversing AANETs.

Table 1 shows the performance comparison with three different symbol parameters FRUDP(1350,16), FRUDP (1350,24), FRUDP(1350,80), where the first component denoted the symbols size and the second component gives the number of source symbols. The channel is set up with 10 Mbps bandwidth and 200 ms RTT. As shown in table 1, FRUDP (1350, 16) has low requirements on the receiver buffer and fast decoding speed due to the small symbol parameters. However, it cannot recover many lost packets since the small encoding block is very vulnerable to burst packet losses, even though the code rate is dynamically adjusted according to the aeronautical channel status. So there are a large number of retransmissions. The encoding block size of FRUDP (1350, 80) is so big that many packets cannot arrive at the receiver in time, and thus the number of available encoding symbols is sometimes insufficient for successful Raptor decoding. As a result, FRUDP (1350, 80) shows a long buffering duration and high rate of retransmissions. The block size of FRUDP (1350, 24) has an appropriate buffering duration and significantly reduces the number of retransmission. Consequently, FRUDP (1350, 24) provides the best performance in terms of throughput.

TABLE 1

Performance Comparison with Different Symbol Parameters

| Protocol Measurement | FRUDP (1350, 16) | FRUDP (1350, 24) | FRUDP (1350, 80) |
|---|---|---|---|
| Throughput (Mbps) | 6.5336 | 9.5704 | 4.8224 |
| Buffering duration (sec.) | 0 | 0 | 1.5136 |
| Number of retransmissions | 30 | 2 | 98 |

Table 2 shows the parameter values used during emulation experiments.

TABLE 2

Parameter Values used in the Experiments

| Parameter | Description | Value |
|---|---|---|
| $P_{size}$ | Packet size (byte) | 1350 |
| $\rho^{under}$ | underestimation probability of packet loss rate estimation | 0.05 |
| $\delta$ | maximum acceptable decoding failure probability | 0.05 |
| $\tau_{succ}$ | target success probability of the Raptor decoding | 0.95 |
| s | Symbol size (byte) | 1350 |
| k | Number of source symbols (byte) | 24 |

Figure 5:
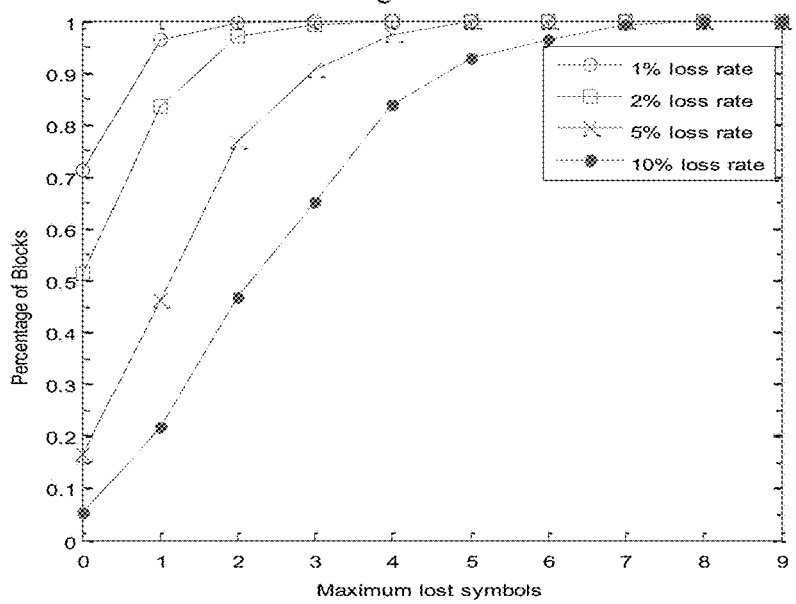
FIG. 5 shows the number of lost symbols of blocks and presents the cumulative distribution.

We can see from FIG. 5 that when the loss rate is 1%, putting m=1 we can obtain $\delta_b(m)$ smaller than $\delta$, but when the loss rate increases to 10%, we need to set m=6 in order to ensure the decoding failure probability is smaller than $\delta$. This result is consistent with the theoretical analysis in Step 2.

Figure 6:
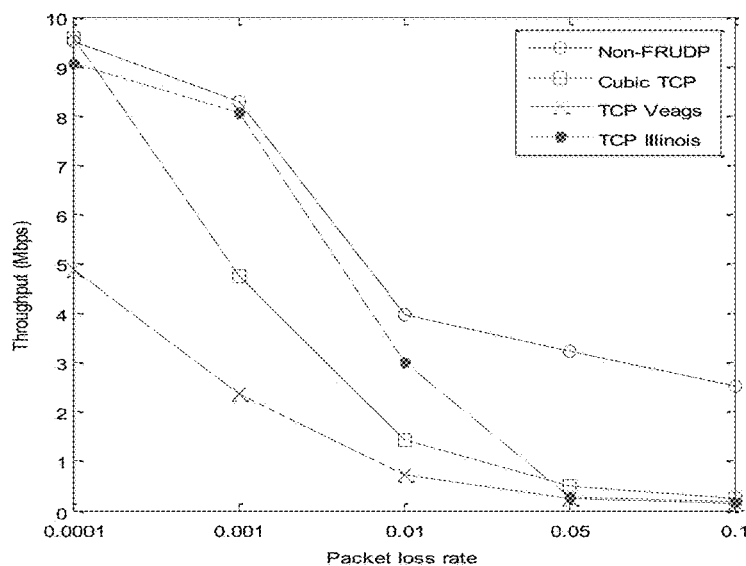
FIG. 6 shows the average throughput as a function of packet loss rate when the channel bandwidth is 10 Mbps and the RTT is 200 ms.
Figure 7:
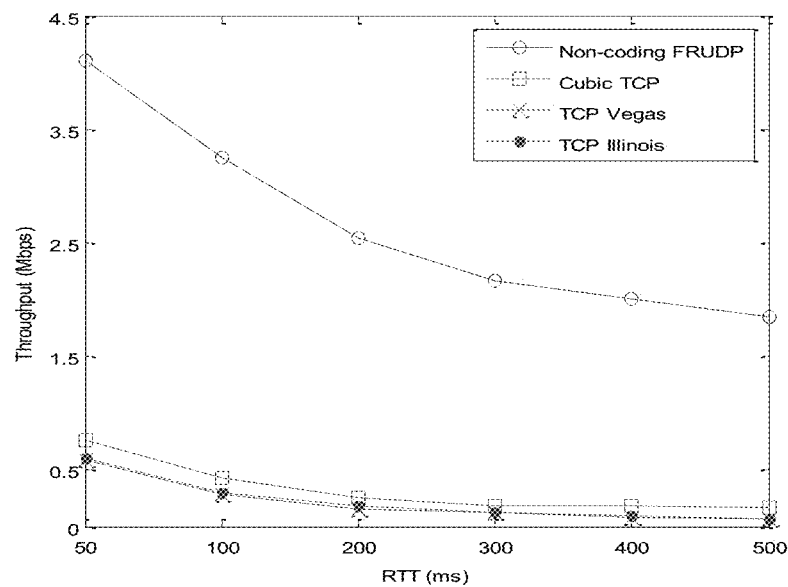
FIG. 7 shows the average throughput for different RTT values when the channel bandwidth is 10 Mbps and the loss rate is 10%.

It can be seen from FIG. 6 that the average throughput of all the protocols decreases as the packet loss rate increases and non-coding FRUDP is able to maintain a high average throughput amongst the protocols. As shown in FIG. 7, the average throughput of all the protocols decreases as the RTT grows, and non-coding FRUDP achieve higher throughout than other TCP variants in all cases.

Figure 8:
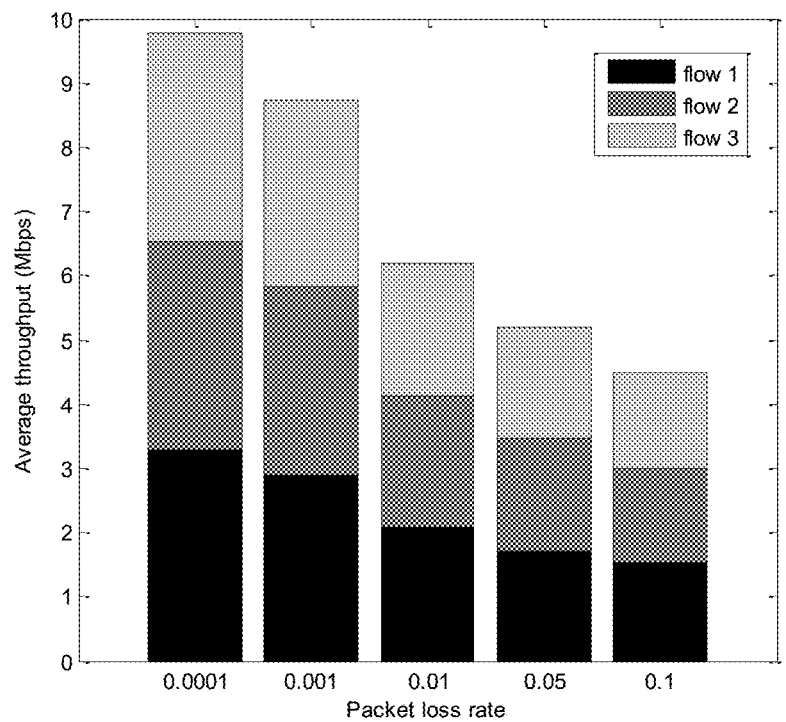
FIG. 8 shows the average throughput of the three users at different packet loss rate when the bottle link is 10 Mbps and the RTT is 50 ms.
Figure 9:
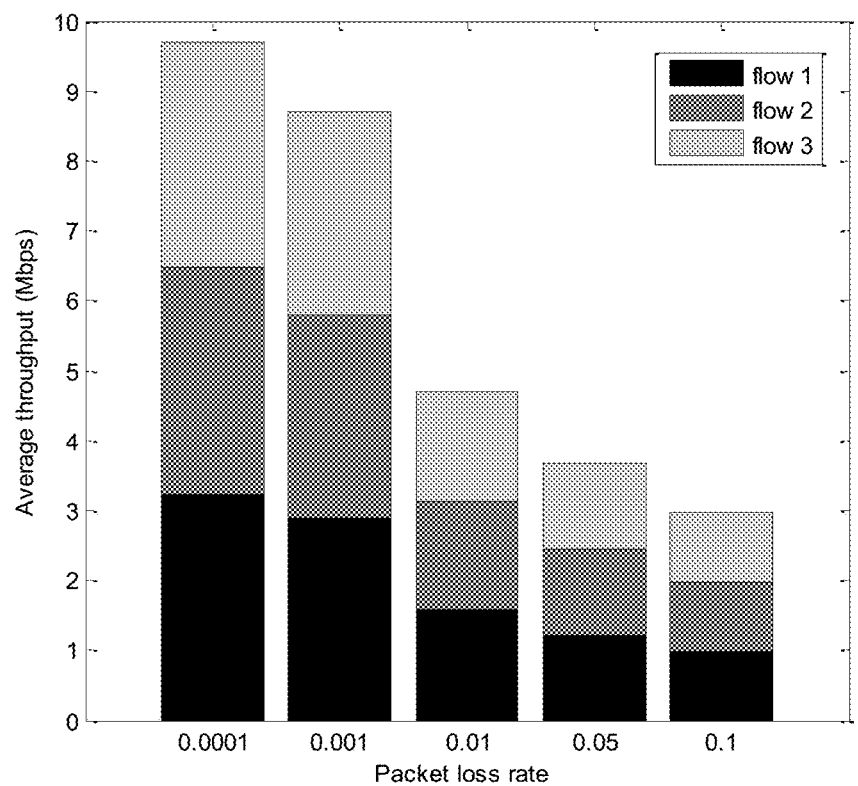
FIG. 9 shows the average throughput of the three users at different packet loss rate when the bottle link is 10 Mbps and the RTT is 200 ms.

Table 3 presents the fairness index (FI) of the three flows in FIG. 8 and FIG. 9. We can see that the FRUDP can have a good fairness performance for different RTT and packet loss rate.

TABLE 3

The results of FI when bandwidth is 10 Mbps.

| RTT | Loss rate | | | | |
|---|---|---|---|---|---|
| | 0.0001 | 0.001 | 0.01 | 0.05 | 0.1 |
| 50 ms | 0.9999 | 0.9996 | 0.9996 | 0.9995 | 0.9997 |
| 200 ms | 0.9998 | 0.9998 | 0.9999 | 0.9998 | 0.9999 |

Figure 10:
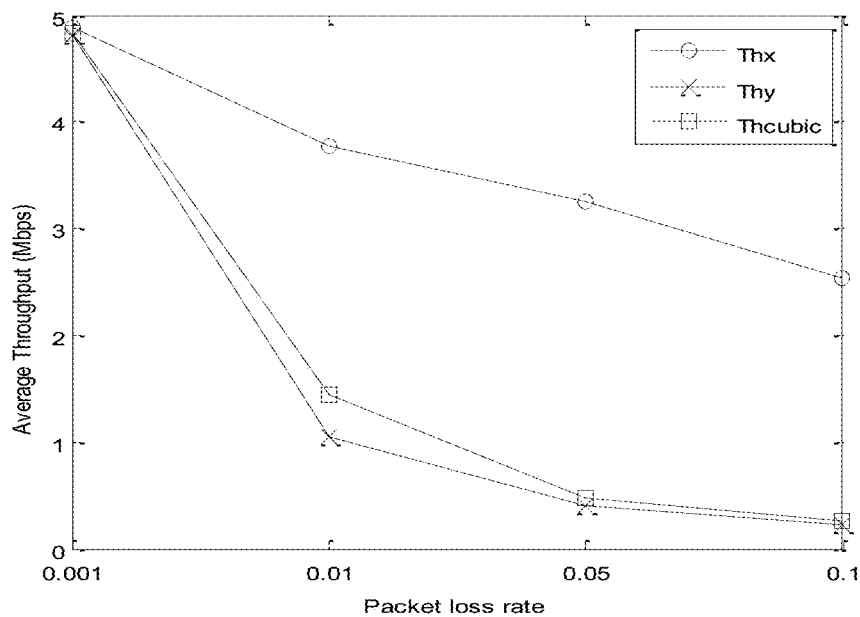
FIG. 10 shows fairness between non-coding FRUDP and Cubic TCP in heterogeneous scenario.

In FIG. 10, we assume two Cubic TCP connections and two non-coding FRUDP connections and all the connections pass through the same type of lossy and high RTT link, i.e., RTT=200 ms. The fairness, $\phi$, is the ratio between the average throughput of non-coding FRUDP connections, $Th_x$, and the average throughput of Cubic TCP connections, $Th_y$, i.e., $\phi=(Th_x/Th_y)$. In FIG. 10, we see that $Th_x$ values are higher than $Th_y$ values, thus resources are not shared equally between Cubic TCP and non-coding FRUDP. This is mostly due to the problems of Cubic TCP in networks with high loss rate and high RTT. In fact, we show that $Th_y \approx Th_{cubic}$, where $Th_{cubic}$ is the average throughput when all connections use Cubic TCP. This means that non-coding FRUDP significantly improves network efficiency without penalizing Cubic TCP flows and the degradation of the Cubic TCP share is mainly because of its shortcomings when applied to networks with high loss rate and high RTT.

Table 4 shows the parameter setting in dynamic aeronautical network scenario and the emulation lasts 120 s, in which 0-30 s is in good state, 30-60 s is in bad state, 60-90 s is in normal state and 90-120 s is in bad state.

TABLE 4

Parameter setting in dynamic aeronautical network scenario

| Parameters | Good state | Normal state | Bad state |
|---|---|---|---|
| Bandwidth | 10 Mbps | 10 Mbps | 10 Mbps |
| RTT | 50 ms | 100 ms | 200 ms |
| Loss rate | 0.5 P loss | P loss | 2 P loss |

Figure 11:
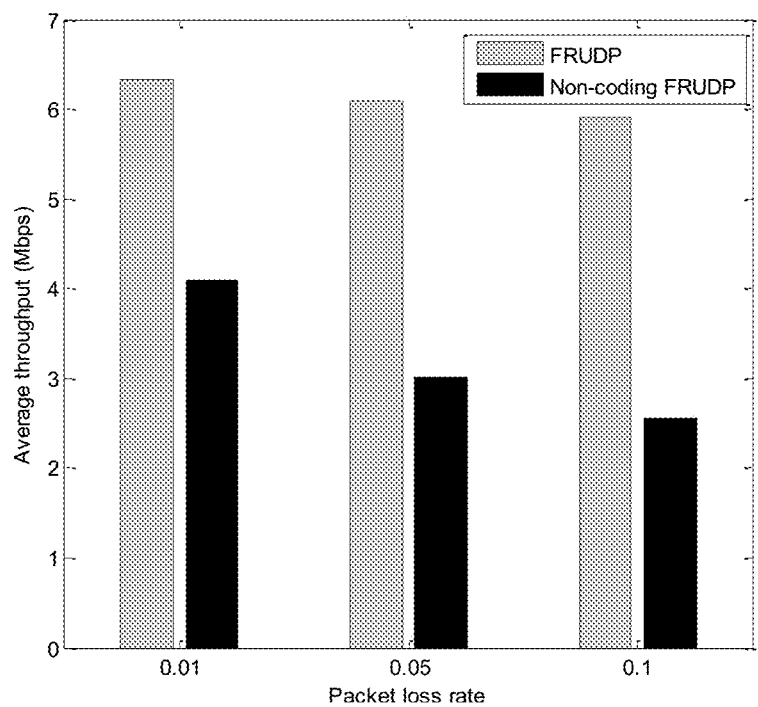
FIG. 11 shows the throughput achieved by FRUDP with the Raptor coding on and off for the network that $P_{loss}$ is 0.01, 0.05 and 0.1 respectively.

We can see from FIG. 11 that FRUDP can adapt to the dynamic network environment well and the throughput performance is improved significantly when Raptor code is employed, especially for the network with high loss rate. Non-coding FRUDP needs to retransmit the packets which are lost in the channel, resulting in frequent retransmission and performance degradation in the network at high loss rate. FRUDP employs Raptor codes as application FEC code to recover from data loss and avoid retransmissions, which can significantly improve the performance for the network at high loss rate and long delay.

The invention claimed is:
1. A reliable data transmission method based on reliable User Datagram Protocol (UDP) and fountain code in an aeronautical ad hoc network formed a plurality of computer devices installed in at least satellites and aircraft, the transmission method comprising:

dividing, performed by a sender computer device of the plurality of computer devices functioning as a first node on the aeronautical network, transmission data into a plurality of data packets, and transmitting the plurality of data packets to a reliability unit, which is executed by one or more additional computer devices of the plurality of computer devices, the reliability unit designing a light-weight feedback, an improved selective negative acknowledgement scheme (SNACK) being implemented to reduce bandwidth asymmetry, the SNACK including a plurality of acknowledgement packets that specify a highest contiguous sequence number of received packets of the plurality of acknowledgement packets and a list of missing sequence numbers, and a novel sliding window mechanism, which is executed by the one or more additional computer devices, is provided to prevent retransmission ambiguity in a transmission control protocol (TCP) and allow for a roundtrip-time (RTT) calculation, the novel sliding window mechanism including a window that continues as long as an acknowledgement for each packet of the plurality of data packets has been received, regardless of whether the packet has been received correctly;

transferring the plurality of data packets to a Raptor encoder buffer, which is executed by the one or more additional computer devices, and starting an encoding timer in order to collect source symbols to deploy encoding, when traffic is higher to cause an amount of the symbols at the Raptor encoder buffer, Raptor encoding is performed with a code rate determined by a code rate determining unit, which is executed by the one or more additional computer devices, and when the traffic is lower so that the Raptor encoder buffer does not have a sufficient number of the symbols to perform the Raptor encoding, an encoding timer ends and the symbols are forwarded directly to the UDP, wherein the code rate is determined by a code rate determining algorithm as follows:
  estimating packet loss rate $P_{loss}$ for a next block b, calculating a Raptor decoding failure rate $\delta_b(m)$ for block b and determining the code rate c;

transmitting generated redundant symbols and the source symbols to a send buffer, which is executed by the one or more additional computer devices, and regulating a transmission rate of UDP flows using a congestion control algorithm that differentiates losses caused by Internet congestion from losses caused by link handoffs, whereby redundancy and the packet loss rate for the next block are regulated in real-time based on time-varying aeronautical network conditions to avoid unnecessary retransmission;

upon receiving the SNACK and determining that the received SNACK includes missing sequence numbers, determining whether packet loss is caused by congestion or the link handoffs, when the packet loss is caused by the link handoffs, a minimum round-trip time (RTT) is set by the round-trip time that is observed now, and when the packet loss is caused by network congestion, the congestion window is reduced, and such that when the packet losses is caused by link handoffs, the congestion window is not reduced and throughput over the aeronautical network is increased;

upon receiving a new acknowledgement, first, dynamically modifying parameters α and $W_{tar}$, setting a threshold value, α to estimate a number of packets cached by a router on a network, $W_{tar}$ is a value of target window, and updating the congestion window; and performing, by a receiver computer device of the plurality of computer devices functioning as a second node on the aeronautical network, Raptor decoding to recover a lost packet, when the Raptor decoding cannot recover all of the source symbols, the reliability unit informs a sender to resend missing symbols to provide reliability, and the receiver computer device periodically feeds network information, including the delay and packet loss rate, back to the sender computer device.

2. The transmission method according to claim 1, wherein a formula to estimate the packet loss rate Ross for the next block b is defined as follows:

$$p_{loss} = \sqrt{\sigma^2_{ploss}} \cdot Q^{-1}(\rho^{under}) + \mu_{ploss}$$

where $P_{loss}$ is Gaussian distributed and represented by $P_{loss} \sim N(\mu_{ploss}, \sigma^2_{ploss})$, $\mu_{ploss}$ and $\sigma^2_{ploss}$ are a mean and variance, which are calculated from a most recently reported values of $P_{loss}$, $\rho^{under}$ is an underestimation probability of $P_{loss}$, Q-function is a tail probability of a standard normal distribution.

3. The transmission method according to claim 1, wherein a formula to calculate Raptor decoding failure rate $\delta_b(m)$ for block b is defined as follows:

$$\delta_b(m) = P((X < n_{min}) \mid X \sim B(n_{enc}, 1 - p_{loss})) = \sum_{i=0}^{n_{min}-1} \binom{n_{enc}}{i}(1 - p_{loss})^i p_{loss}^{n_{enc}-i}$$

where $n_{min}$ is a minimum number of packets required for successful Raptor decoding and $n_{min}=(1+\varepsilon)k$, $\varepsilon$ is a minimum symbol overhead with target decoding success probability $\tau_{succ}$, k is a given number of source symbols, $n_{enc}$ is a number of encoded symbols and $n_{enc}=n_{min}+m$, where m is a number of extra packets sent for a block to protest against channel loss.

4. The transmission method according to claim 1, wherein a formula to determine the code rate c is defined as follows:

$$c = \frac{n_{min} + m*}{k}$$

wherein in order to ensure a block has a maximum acceptable decoding failure probability and to reduce redundancy, a value of m is set to a smallest integer m* such that $\delta_b(m)$ is no more than $\delta$, and the maximum acceptable decoding failure probability $\delta$ is a threshold to predict whether a block is successfully decoded by a receiver.

5. The transmission method according to claim 1, wherein determining whether loss is caused by congestion or link handoffs is described as follows:

calculating a number of queued packets in the network in accordance with a formula diff=(W/baseRTT−W/SRTT)×baseRTT; where diff refers to a difference between the current congestion window and the network, W refers to current congestion window, baseRTT is a minimum RTT that has been observed so far, SRTT is an exponentially smoothed RTT and maintained with a method used in TCP Reno; W/baseRTT is an expected throughput, and W/SRTT is an actual throughput; and comparing a value of cliff and a:
when diff>α, calculate values of throughput Thr, last_Thr by a successive two ACK; and
estimate packet loss reason, when Thr<last_Thr, the losses are caused by link handoffs, otherwise the losses are caused by network congestion.

6. The transmission method according to claim 1, wherein a formula to reduce the congestion window is defined as follows:

$$W = W*(1-\beta)$$

where β is a window decrease constant.

7. The transmission method according to claim 5, wherein updating parameters α and $W_{tar}$ is described as follows:

when diff is less than α, and SRTT is less than last_SRTT, which is a value of smoothed RTT calculated for a last ACK, or α is equal to 1, queuing is light, and the target window $W_{tar}$ is increased in order to fully use a bandwidth;

when diff is greater than α, when SRTT is greater than last_SRTT and a is greater than 1, the link handoffs or network has congestion, and an increase of SRTT is caused by link handoffs, baseRTT is updated by the RTT that is observed now, and otherwise the queuing along the path becomes heavy, and the value of α is reduced to be α=α−1; and when SRTT is less than or equal to last_SRTT, the queuing is lighter, and the value of α is increased to be α=α+1.

8. The transmission method according to claim 1, wherein a formula to update the congestion window is defined as follows:

$$W(t) = C(t-K)^3 + W_{tar}$$

where $$K = \sqrt[3]{\frac{W_{max}\beta}{C}}$$

and K is a time period to increase W to $W_{max}$ when no additional loss event occurs, C is a Cubic parameter, t is an elapsed time from the last window reduction, and $W_{max}$ is a window size where the loss event occurs.

* * * * *